(12) United States Patent
Mate (10) Patent No.: US 12,375,050 B2
(45) Date of Patent: Jul. 29, 2025

(54) AMPLIFYING A BIPOLAR INPUT SIGNAL (71) Applicant: Solid State Logic UK Limited, Oxford (GB)

(72) Inventor: David Joseph Mate, Warwickshire (GB)

(73) Assignee: Solid State Logic UK Limited, Oxford (GB)

( * ) Notice: Subject to any disclaimer, the term of this patent is extended or adjusted under 35 U.S.C. 154(b) by 403 days.

(21) Appl. No.: 17/963,238

(22) Filed: Oct. 11, 2022

(65) Prior Publication Data

US 2023/0110145 A1 Apr. 13, 2023

(30) Foreign Application Priority Data

Oct. 12, 2021 (GB) ........................ 2114559

(51) Int. Cl.
*H03F 3/45* (2006.01)
(52) U.S. Cl.
CPC ..... *H03F 3/45179* (2013.01); *H03F 2200/03* (2013.01); *H03F 2203/45116* (2013.01)
(58) Field of Classification Search
CPC ............ H03F 3/45179; H03F 2200/03; H03F 2203/45116; H03F 1/342; H03F 3/183; H03F 3/265; H03F 3/45475; H03F 1/3217; H03F 3/185; H03F 3/3008; H03F 3/3022; H03F 2203/30015; H03F 2203/30027; H03F 2203/30031; H03F 2203/30033; H03F 2203/30036; H03F 2203/30045; H03F 2203/30063; H03F 2203/30078; H03G 1/0029
USPC ........................................................ 330/253
See application file for complete search history.

(56) References Cited

U.S. PATENT DOCUMENTS 4,833,423 A 5/1989 Molloy
2015/0054584 A1* 2/2015 Chang ................... H03F 1/3205
330/291

FOREIGN PATENT DOCUMENTS

EP 0104852 A2 4/1984
GB 2502122 A 11/2013
JP S5921109 A 2/1984

OTHER PUBLICATIONS

Corresponding Great Britain Patent Application No. GB2114559.4, Search Report dated Apr. 11, 2022, 1 page.

* cited by examiner

*Primary Examiner* — Andrea Lindgren Baltzell
*Assistant Examiner* — Jose E Pinero
(74) *Attorney, Agent, or Firm* — Cooper Legal Group LLC (57) ABSTRACT

A bipolar amplification circuit has a control amplifier (101), a dependent current source (102) configured to supply current to an output terminal (104) and driven by an output from the control amplifier (101). A dependent current sink (103) is configured to receive current from the output terminal (104) and is also driven by the output from the control amplifier (101). The control amplifier includes an inverting input (105) and an input signal is supplied to this inverting input. A negative feedback signal of a first polarity is supplied to the inverting input from said dependent current source and a negative feedback signal of a second polarity is supplied to said inverting input from said dependent current sink.

17 Claims, 6 Drawing Sheets

AMPLIFYING A BIPOLAR INPUT SIGNAL

CROSS REFERENCE TO RELATED APPLICATIONS

This application claims priority from United Kingdom Patent Application number 2114559.4, filed on Oct. 12, 2021, the whole contents of which are incorporated herein by reference.

BACKGROUND OF THE INVENTION

The present invention relates to an apparatus configured to amplify a bipolar input signal and a method of amplifying a bipolar input signal. A high impedance current source is known to those of skilled in the field of analog electronics and is identified as the Howland current pump. This uses the positive and negative inputs of an operational amplifier to make a high impedance current source (current pump). However, the inventor has identified difficulties with this circuit, particularly in applications where many such circuits are required to be connected in parallel.

BRIEF SUMMARY OF THE INVENTION

According to a first aspect of the present invention, there is provided an apparatus configured to amplify a bipolar input signal, comprising: a positive supply rail and a negative supply rail; an operational amplifier having an inverting input and a non-inverting input; a dependent current source connected to said positive supply rail and configured to supply current to an output terminal, wherein said dependent current source is driven by an output from said operational amplifier; a dependent current sink connected to said negative supply rail and configured to receive current from said output terminal, wherein said dependent current sink is also driven by the output from said operational amplifier, wherein: an input signal is supplied to said inverting input of said operational amplifier; a first negative feedback signal is supplied to said inverting input of said operational amplifier from said dependent current source; and a second negative feedback signal is supplied to said inverting input from said dependent current sink, such that a feedback current difference drives said operational amplifier in combination with said input signal.

The dependent current source and the dependent current sink may include field effect transistors (FETs) that may include a positive metal-oxide-silicone (PMOS) FET and a negative metal-oxide-silicone (NMOS) FET. As is known in the art, each FET includes a gate, a source and a drain. In an embodiment, the source of the PMOS FET is resistively connected to the positive supply rail; and the source of said NMOS FET is resistively connected to the negative supply rail.

In an embodiment, the apparatus further comprises a first level shifting circuit for applying a first bias to said dependent current source; and a second level shifting circuit for applying a second bias to said dependent current sink. The first level shifting circuit may apply the first bias as a voltage to the gate of said PMOS FET and the second level shifting circuit may apply the second bias as a voltage to the gate of said NMOS FET.

An embodiment further comprises an output port that is connected to both the drain of said PMOS FET and the drain of said NMOS FET. An embodiment may further comprise a supply noise compensator, connected between said positive supply rail and said negative supply rail, which in turn supplies a noise compensation signal to the non-inverting input of said operational amplifier. The supply noise compensator may comprise a voltage dividing network.

According to a second aspect of the present invention, there is provided a method of amplifying a bipolar input signal, comprising the steps of: energizing a dependent current source from a positive supply rail; driving said dependent current source from an output of an operational amplifier to supply current to an output port; energizing a dependent current sink from a negative supply rail; driving said dependent current sink from said output of said operational amplifier to receive current from an output port; supplying an input signal to an inverting input of said operational amplifier; supplying a first negative feedback signal from said dependent current source to said inverting input; supplying a second negative feedback signal from said dependent current sink to said inverting input; and driving the operational amplifier from the combination of said input signal, said first feedback signal and said second feedback signal.

Embodiments of the invention will be described, by way of example only, with reference to the accompanying drawings. The detailed embodiments show the best mode known to the inventor and provide support for the invention as claimed. However, they are only exemplary and should not be used to interpret or limit the scope of the claims. Their purpose is to provide a teaching to those skilled in the art. Components and processes distinguished by ordinal phrases such as "first" and "second" do not necessarily define an order or ranking of any sort.

DETAILED DESCRIPTION OF EMBODIMENTS OF THE INVENTION

Figure 1:
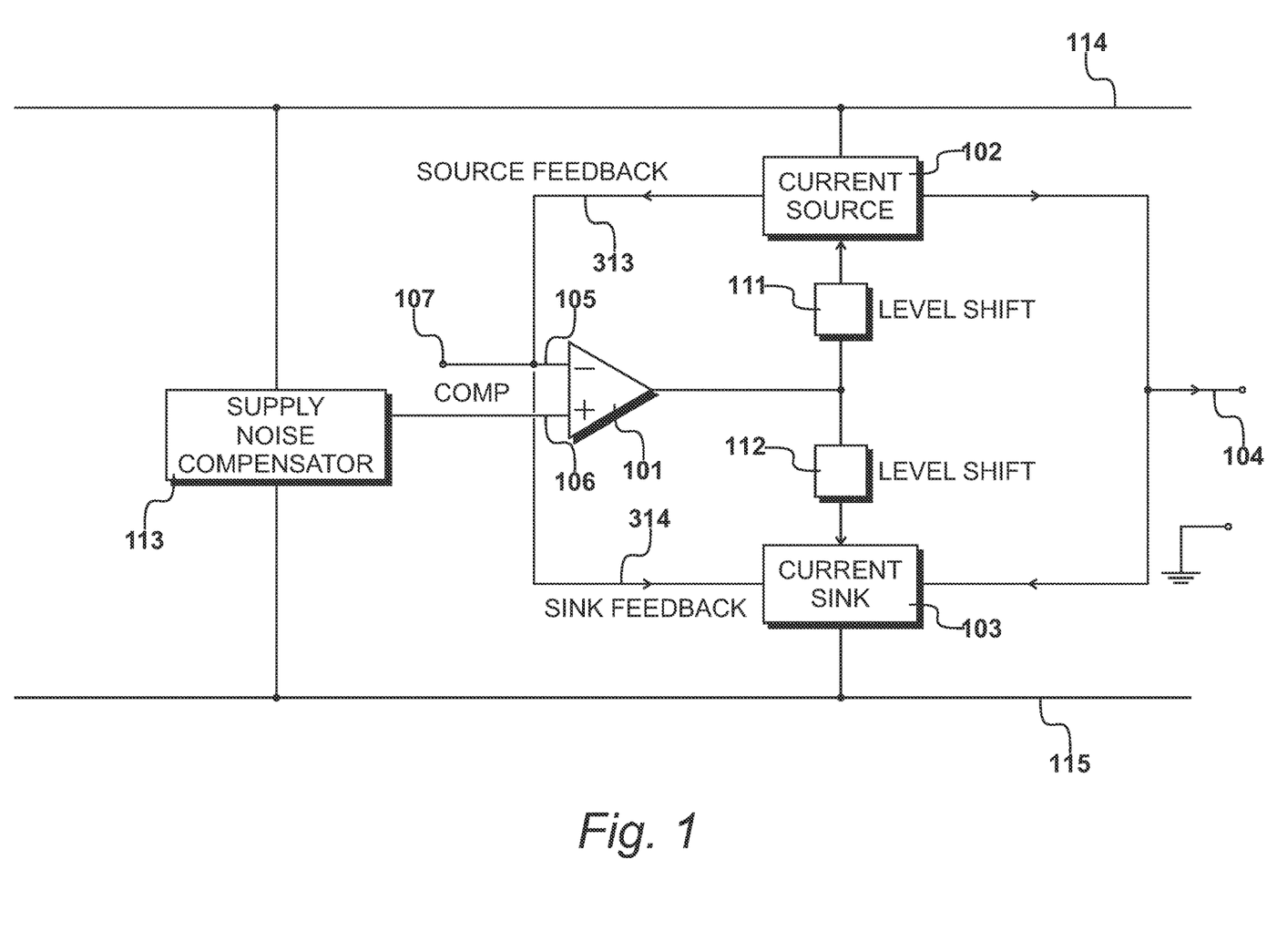
FIG. 1 shows a schematic representation of an apparatus for bipolar amplification.

FIG. 1

A schematic representation of an apparatus for bipolar amplification is shown in FIG. 1. The apparatus includes a control amplifier 101, a dependent current source 102 and a dependent current sink 103. The dependent current source supplies current to an output terminal 104 and is driven by an output from the control amplifier 101. The dependent current sink 103 receives current from the output terminal 104 and is also driven by the output from the control amplifier 101.

The control amplifier 101 includes an inverting input 105 and a non-inverting input 106. An input port 107 allows an input signal to be supplied to the inverting input 105. In addition, a negative feedback signal of a first polarity is supplied to the inverting input 105 from the dependent current source 102. A negative feedback signal of a second polarity is also supplied to the inverting input 105 from the dependent current sink 103. The second polarity is opposite to the first polarity, such that a feedback current difference drives the control amplifier in combination with the input signal.

Appropriate voltage levels are maintained across the current source by means of a first level shifting circuit 111. Similarly, appropriate voltage levels are maintained across the current sink 103 by means of a second level shifting circuit 112.

In an embodiment, the apparatus also comprises a supply noise compensator 113 that is connected between a positive supply rail 114 and a negative supply rail 115. The supply noise compensator 113 supplies a noise compensation signal to the non-inverting input 106 of the control amplifier. In an embodiment, the supply noise compensator comprises a voltage dividing network, described with reference to FIG. 3.

Figure 2:
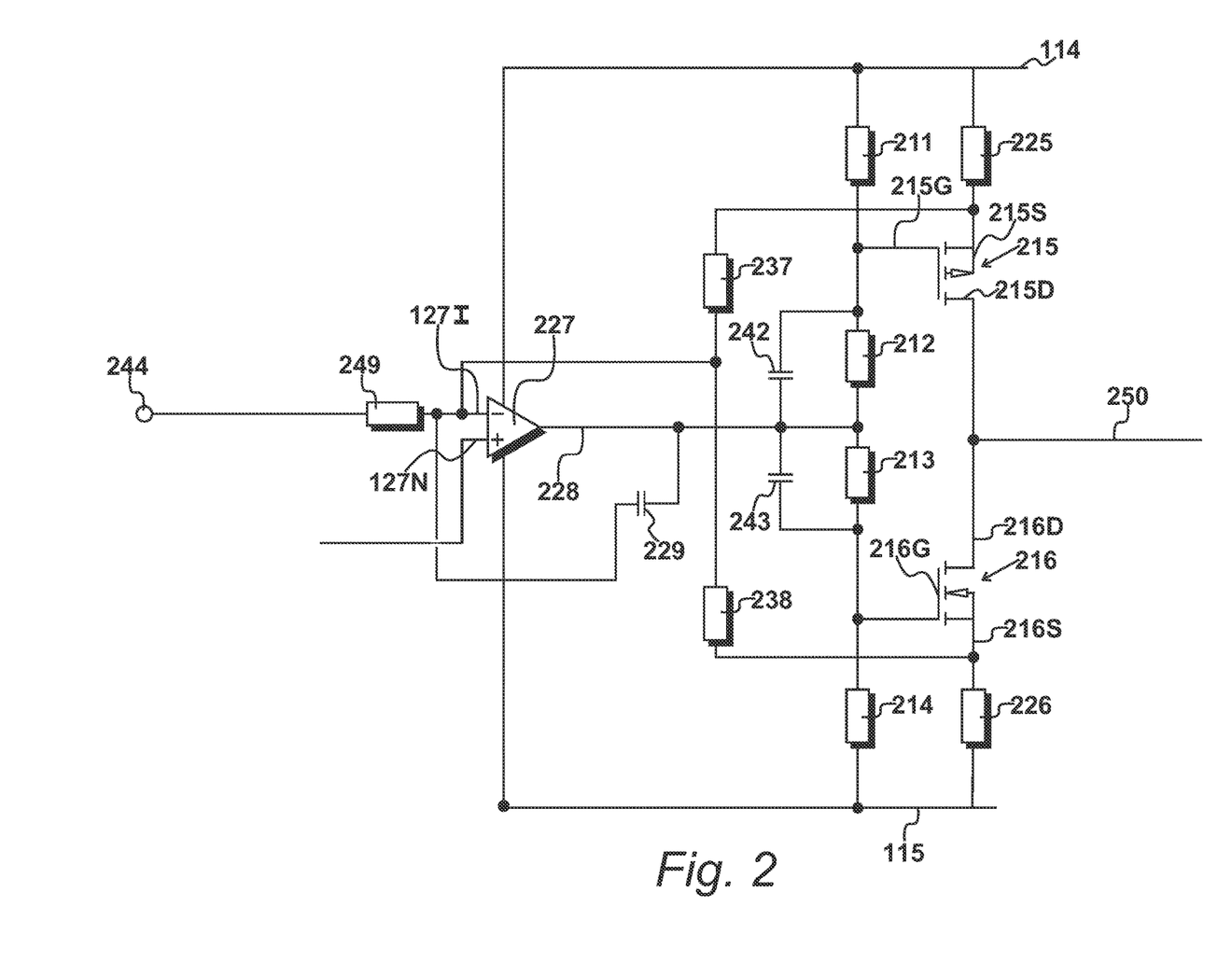
FIG. 2 shows an implementation of the embodiment identified in FIG. 1.

FIG. 2

An implementation of the embodiment described with reference to FIG. 1 is detailed in FIG. 2. This, it should be emphasised, represents a specific example and many modifications could be made both to components and component values while embodying an aspect of the invention.

In this embodiment, the positive supply rail 114 applies plus fifteen volts and the negative supply rail 115 applies minus fifteen volts. The first level shifting circuit 111 is implemented by means of a first resistor 211 and a second resistor 212. Similarly, the second level shifting circuit 112 is implemented by a third resistor 213 and a fourth resistor 214. In this embodiment, these resistors are connected in series between the positive supply rail 114 and the negative supply rail 115. In an embodiment, the first resistor 211 and the fourth resistor 214 have a resistance of 4K ohms, while the second resistor 212 and a third resistor 213 have a resistance of 2K ohms.

It is possible for the current source 102 and the current sink 103 to be implemented using bipolar transistors but, for many applications, transistors of this type introduce unwanted nonlinearities. In an audio application, for example, such nonlinearities may introduce harmonic distortion and appropriate compensation would be required to achieve high levels of audio quality. In the implementation of FIG. 2, metal-oxide-silicon (MOS) field-effect transistors (FETs) are deployed. Thus, the implementation includes a PMOS FET 215 (possibly a BSS84) along with an NMOS FET 216, that may be a 2N7002. Each FET 215/216 includes a gate 215G/216G, a source 215S/216S and a drain 215D/216D.

The first resistor 211 and the second resistor 212 perform level shifting up to the positive supply rail 114 to drive the gate 115G of the PMOS FET 215, while the third resistor 213 and the fourth resistor 214 perform level shifting down to the negative supply rail to drive the gate 216G of the NMOS FET 216.

The source 215S of the PMOS FET 215 is connected to the positive supply rail 114 via a fifth resistor 225. The source 216S of the NMOS FET 216 is connected to the negative supply rail via a sixth resistor 226. In an embodiment, the fifth resistor 225 and the sixth resistor 226 each have a resistance of two-thousand-two-hundred (2200) ohms.

The control amplifier 101 is implemented by an operational amplifier 227, arranged to receive power from the positive supply rail 114 and the negative supply rail 115. The operational amplifier 227 includes an inverting input 127I and a noninverting input 127N. A first voltage drop occurs across the fifth resistor 225 and a second voltage drop occurs across the sixth resistor 226, that are both applied as negative feedback to the inverting input 127I of the operational amplifier via a seventh resistor 237 and an eighth resistor 238 respectively. In an embodiment, the seventh resistor 237 and the eighth resistor 238 have a resistance of 10K ohms. In an embodiment, the noninverting input 227N may be grounded. Alternatively, as described with reference to FIG. 1, the noninverting input 227N may receive a noise compensation signal from a supply noise compensator 113.

The operational amplifier 227 provides an op-amp output 228 and this op-amp output is also connected to the inverting input 227I via a feedback capacitor 229 that may have a capacitance of 10 pF. A second capacitor 242 is connected across the second resistor 212 and a third capacitor is connected across the third resistor 213. These capacitors are included to compensate for phase distortion introduced by the operational amplifier 227.

An input signal is applied to an input port 244, which is in turn supplied to the inverting input 227I via a ninth resistor 249 that may have a resistance of 10 k ohms. An output current from the circuit appears on an output line 250 that is connected to both the drain 215D of the PMOS FET 215 and the drain 216D of the NMOS FET 216. A load may be connected between the output line 250 and ground such that, irrespective of the load's impedance, a predetermined current will be deployed.

In operation, if the op-amp output 228 swings positive, it will apply a positive voltage to gate 215G, thereby making the PMOS FET 215 less conductive; it effectively being turned off more. The NMOS FET 216 will be turned on to some extent.

Feedback is taken from the voltage drop across the fifth resistor 225 and the voltage drop across the sixth resistor 226. The noninverting input 227N of the operational amplifier 227 is grounded, possibly via a noise compensator, therefore the operational amplifier 227 will act to achieve a condition where the inverting input also adopts a potential of zero volts. Under this condition, the op-amp output 228 does not produce an output current.

Current contributions are provided to the inverting input 127I from the seventh resistor 237 and the eighth resistor 238. If these contributions are to be zero, the voltages at source 215S need to be of an equal magnitude and of opposite sense. This allows a setup condition to be established without any reference to the device specific parameters of the FETs 215/216. However, the voltages on the supply rails should be similarly equal and opposite, such that they sum to zero.

An input current may be supplied to the circuit by applying an input voltage to input port 244. For the purpose of this an example, it is assumed that this results in an input current of plus one milliamp. In response to this, the op-amp output 228 will start to drive negative, making the NMOS FET 216 less conductive and the PMOS FET 215 more conductive. The circuit will stabilize when the combined contribution through the seventh resistor 237 and the eighth resistor 238 reaches one milliamp, thereby cancelling the one milliamp input. To achieve this, the voltage drop across the eighth resistor 238 will need to increase by zero point zero five volts and the voltage drop across the seventh resistor 237 will need to decrease by zero point zero five volts, so that the combined contribution will be close to zero. This will cause the current flowing through the fifth resistor 225 to change and the current flowing through the sixth resistor 226 to change, such that these currents will no longer be equal and opposite. Thus, an output current will be presented on an output line 250 as a result of this current difference.

In this implementation, voltage drops across resistors connected to the supply rails are included in the feedback paths. Consequently, disturbances in the supply voltage are added to the feedback path and, if they are in phase, they will have an effect on the output. For example, if the positive rail jumps from plus fifteen volts to plus sixteen volts and the negative rail jumps from minus fifteen volts to minus fourteen volts, this will disturb the operation of the circuit. To nullify the effect of in-phase supply voltage disturbances, the supply noise compensator, in the form of a divider network, may be provided. A compensating voltage is thereby supplied to the noninverting input 227N of the operational amplifier 227.

Figure 3:
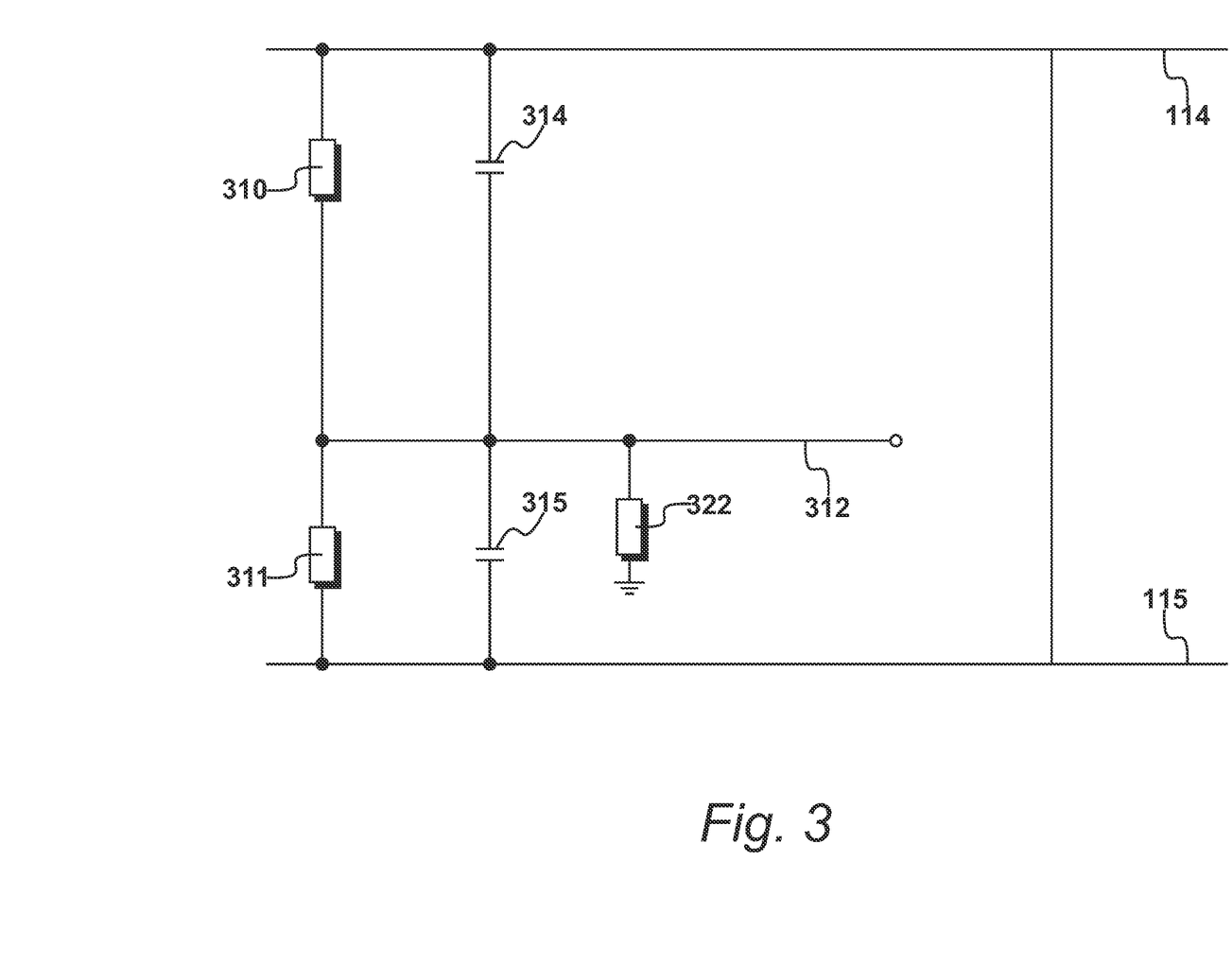
FIG. 3 shows an example of a supply noise compensator of the type identified in FIG. 1.

FIG. 3

An example of a supply noise compensator 113 is shown in FIG. 3. A compensating voltage is established by a voltage divider formed by a tenth resistor 310 in series with an eleventh resistor 311, connected across the positive supply rail 114 and the negative supply rail 115. The tenth resistor 310 and the eleventh resistor 311 may each have a resistance of 1K ohms.

The compensating signal is supplied on a supply compensating line 312 which is also connected to the positive supply rail 114 by a fourth capacitor 314 and connected to the negative supply rail by a fifth capacitor 315; each of which may have a capacitance of 285 pF. A twelfth resistor 322 connects the supply compensating line 312 to ground.

Figure 4:
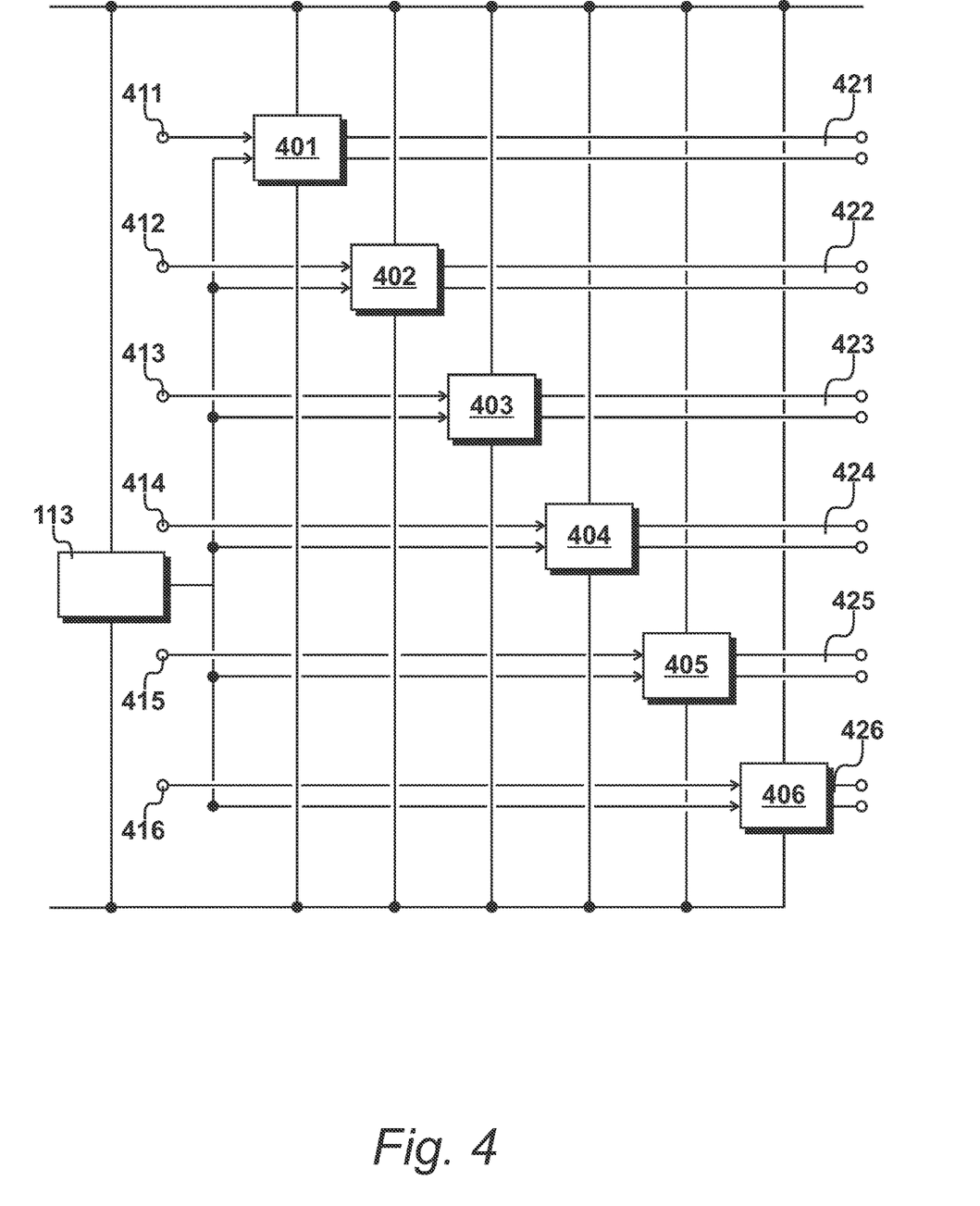
FIG. 4 shows a system having many amplification circuits of the type shown in FIG. 2.

FIG. 4

A system is shown in FIG. 4 that has a plurality of amplification circuits of the type described with reference to FIG. 2. In the example shown in FIG. 4, six amplification circuits are provided identified as 401 to 406. Each receives a respective input signal via a respective input port 411 to 416. Similarly, respective current source outputs are provided at 421 to 426. When configured in this way, given that the amplification circuits 401 to 406 are substantially similar, it is possible to provide a single supply noise compensator 113, that may be implemented substantially in line with the circuit described with reference to FIG. 3.

In the system of FIG. 4, each amplifier may be configured to drive a respective load which, for example, may take the form of an actuator, motor or other active device.

Figure 5:
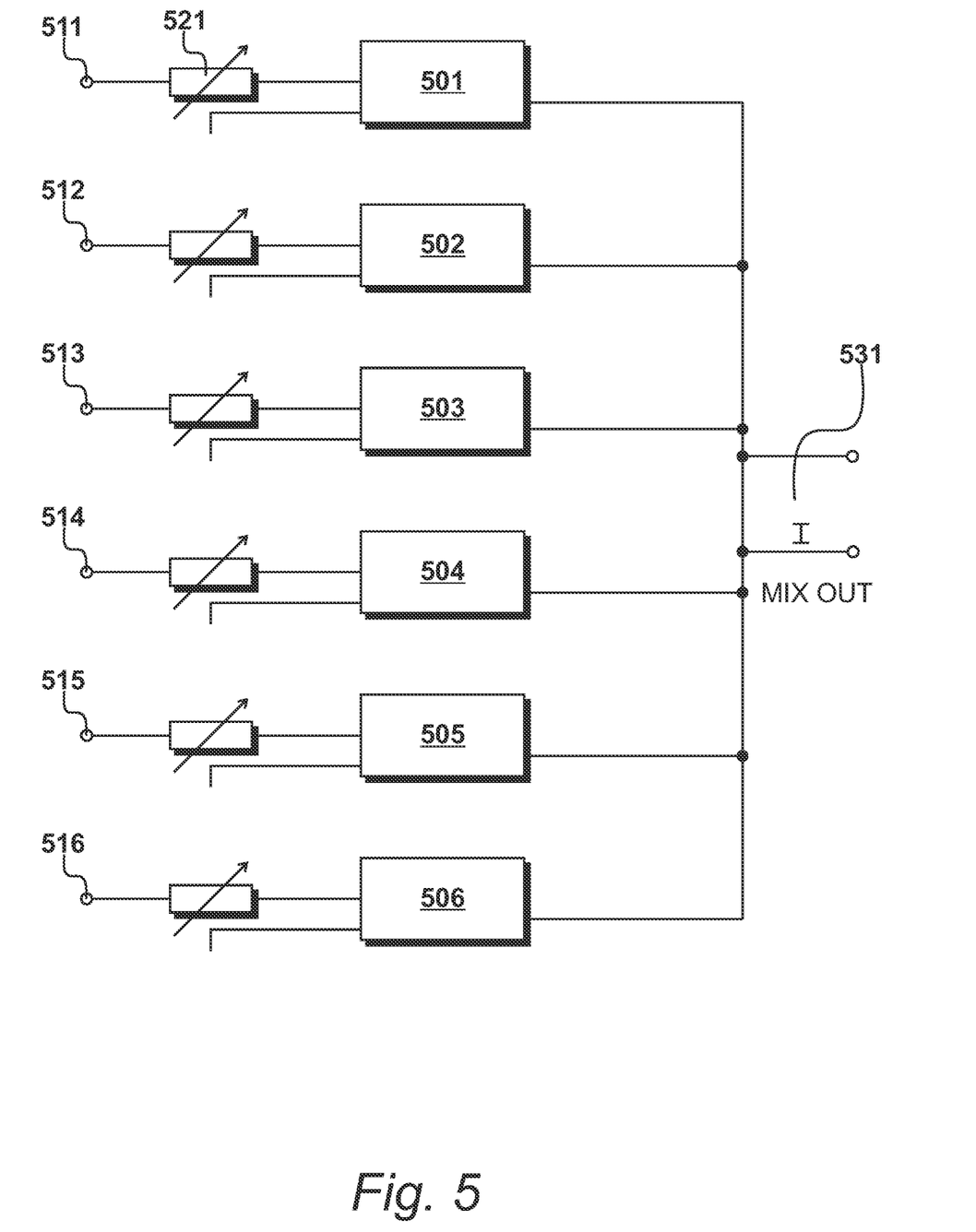
FIG. 5 shows an alternative system with multiple examples of the amplification circuit shown in FIG. 2.

FIG. 5

An alternative system is shown in FIG. 5 in which multiple examples of the amplification circuit described with reference to FIG. 2 are included, identified as circuits 501 to 506. In this example, the system receives audio signals via respective audio inputs 511 to 516. Input levels are controlled by respective input level controllers, including a first input level controller 521. The purpose of the system is to facilitate audio mixing, such that the outputs from the individual amplification circuits 501 to 506 are combined to provide a single current source output 531.

It should be appreciated that in examples of this type, appropriate switching is also included, such that selections may be made in terms of which input signals contribute to the output. In an embodiment, substantially more amplification circuits of this type may be included, typically in excess of one hundred. As is known in the art, several systems of this type may be included to facilitate the creation of sub-mixes, usually so that these may be subsequently treated in a substantially similar fashion before being added to an overall output mix. It should also be appreciated that systems of this type include duplication to provide left and right stereo channels.

Figure 6:
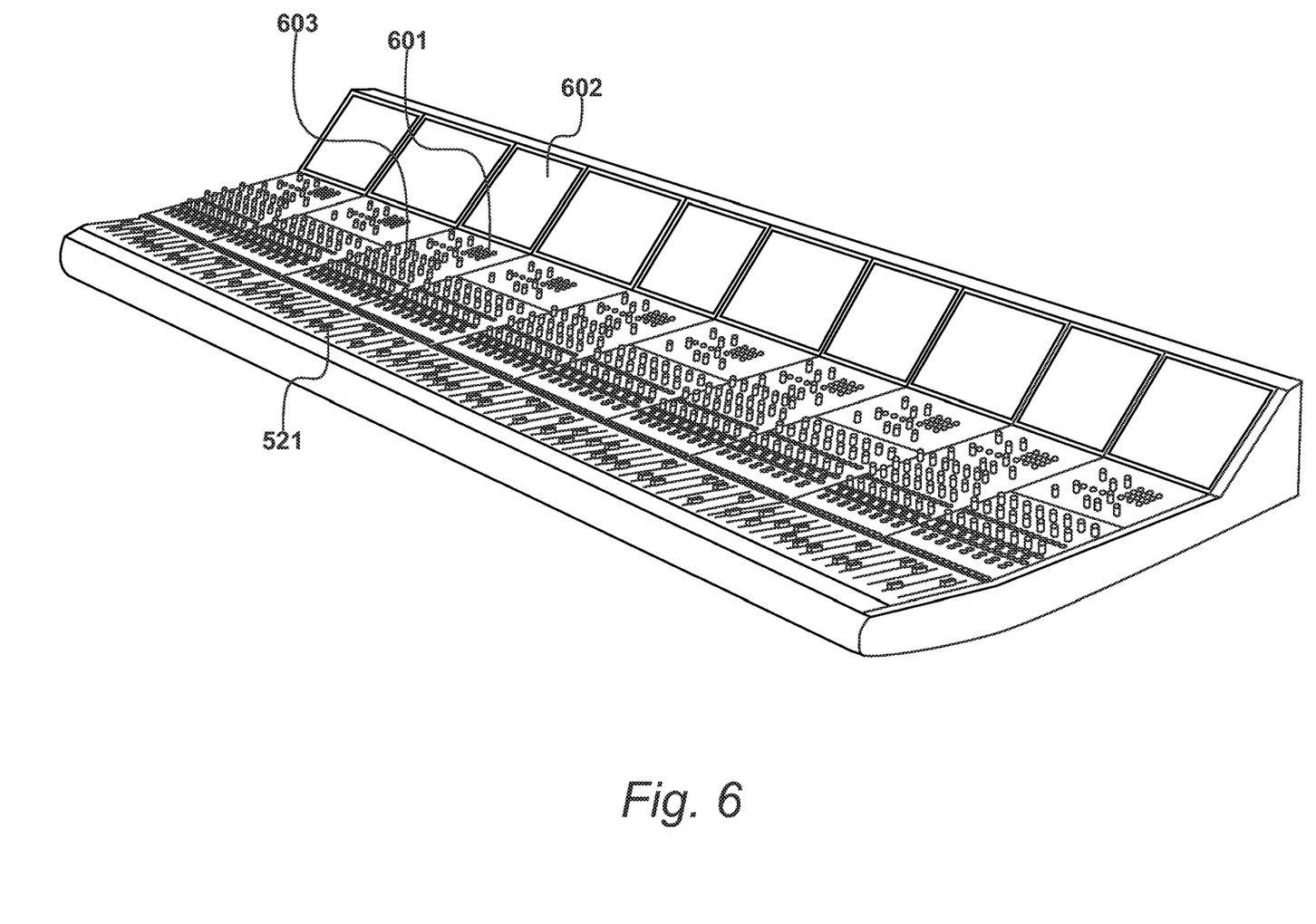
FIG. 6 shows an audio mixing desk including a system of the type shown in FIG. 5.

FIG. 6

The system for adjusting and combining audio signals described with reference to FIG. 5 may be implemented within an audio mixing desk or console of the type shown in FIG. 6. Audio controllers, such as the first input level controller 521 may be implemented as sliders at the front of the mixing console. Switches 601 allow specific combinations of amplification circuits to be combined, thereby allowing sub-mixes and main mixes to be configured. Configuration data may be displayed on a visual display unit 602 and effects for the mix, such as equalisation and compression etc may be selected by appropriate knobs 603.

The apparatus facilitates the deployment of a method of amplifying a bipolar signal by driving a dependent current source from a control amplifier output to supply current to an output port while driving a dependent current sink from the control amplifier to receive current from the output port. An input signal is supplied to an inverting input of the control amplifier, negative feedback of a first polarity is supplied from the dependent current source to the inverting input and a negative feedback signal of a second plurality supplied from the dependent current sink to the inverting input. The control amplifier is driven from the combination of the input signal, the first polarity feedback signal and the second polarity feedback signal. A supply noise compensator may supply a compensating signal to the noninverting input of the operational amplifier. The compensating signal may be supplied to many amplifiers within the system.

If no signal is applied to the input port and the feedback currents cancel, by being equal but of opposite polarity, the result is zero and the operational amplifier is not be driven one way or the other. However, the current source in the current sink would not be at zero because they require a standing current. The current source and the current sink do not need to reach zero in order to cancel each other out. Thus, for a specific implementation, a decision is required in terms of how much current may be allowed to dissipate while the circuit is not actually doing anything.

The dependent current source supplies a feedback signal in response to the output from the operational amplifier. This is also related to the source current being supplied to the output. Similarly, the independent current sink supplies a similar feedback term to the operational amplifier proportional to the sink current been taken from the output terminal. These two feedback terms are opposite in polarity and therefore subtract at the operational amplifier. The difference in these feedback currents results in the production of a drive signal to the operational amplifier using the inverting input terminal of the operational amplifier.

The noise compensator identifies any in-phase noise voltages existing on the positive and negative supply rails and extracts an error term of the correct magnitude and phase to cancel any error that the unwanted noise could produce over a broad frequency range. This compensation signal is applied to the noninverting input of the operational amplifier. Furthermore, as described with reference to FIG. 4 and FIG. 5, this correction signal may also be connected to any other similar circuits within the system.

The invention claimed is:

1. An apparatus configured to amplify a bipolar input signal, comprising:
a positive supply rail and a negative supply rail;
an amplification assembly; and
a supply noise compensator, wherein:
said amplification assembly comprises:
an operational amplifier having an inverting input and a non-inverting input;
a dependent current source connected to said positive supply rail and configured to supply current to an output terminal, wherein said dependent current source is driven by an output from said operational amplifier; and
a dependent current sink connected to said negative supply rail and configured to receive current from said output terminal, wherein said dependent current sink is also driven by the output from said operational amplifier, wherein:
an input signal is supplied to said inverting input of said operational amplifier;
a first negative feedback signal is supplied to said inverting input of said operational amplifier from said dependent current source; and
a second negative feedback signal is supplied to said inverting input from said dependent current sink, such that a feedback current difference drives said operational amplifier in combination with said input signal;
said supply noise compensator is connected between said positive supply rail and said negative supply rail; and
said supply noise compensator supplies a noise compensation signal to said non-inverting input of said operational amplifier.

2. The apparatus of claim 1, wherein said dependent current source and said dependent current sink include field effect transistors (FETs).

3. The apparatus of claim 2, wherein said FETs include a positive metal-oxide-silicone (PMOS) FET and a negative metal-oxide-silicone (NMOS) FET.

4. The apparatus of claim 3, wherein each said FET includes a gate, a source and a drain;
the source of said PMOS FET is resistively connected to said positive supply rail; and
the source of said NMOS FET is resistively connected to said negative supply rail.

5. The apparatus of claim 1, further comprising:
a first level shifting circuit for applying a first bias to said dependent current source; and
a second level shifting circuit for applying a second bias to said dependent current sink.

6. The apparatus of claim 4, further comprising:
a first level shifting circuit for applying a first bias to said dependent current source; and
a second level shifting circuit for applying a second bias to said dependent current sink.

7. The apparatus of claim 6, wherein:
said first level shifting circuit applies said first bias as a voltage to the gate of said PMOS FET; and
said second level shifting circuit applies said second bias as a voltage to the gate of said NMOS FET.

8. The apparatus of claim 4, further comprising an output port, wherein said output port is connected to both the drain of said PMOS FET and the drain of said NMOS FET.

9. The apparatus of claim 1, wherein said supply noise compensator comprises a voltage dividing network.

10. A system configured to amplify a plurality of bipolar input signals, comprising:
a positive supply rail and a negative supply rail;
a plurality of amplification assemblies; and
a supply noise compensator, wherein each of said plurality of amplification assemblies comprises:
an operational amplifier having an inverting input and a non-inverting input;
a dependent current source connected to said positive supply rail and configured to supply current to an output terminal, wherein said dependent current source is driven by an output from said operational amplifier; and
a dependent current sink connected to said negative supply rail and configured to receive current from said output terminal, wherein said dependent current sink is also driven by the output from said operational amplifier, wherein:
an input signal is supplied to said inverting input of said operational amplifier;
a first negative feedback signal is supplied to said inverting input of said operational amplifier from said dependent current source;
a second negative feedback signal is supplied to said inverting input from said dependent current sink, such that a feedback current difference drives said operational amplifier in combination with said input signal,
said supply noise compensator is connected between said positive supply rail and said negative supply rail; and
said supply noise compensator supplies a noise compensation signal to said non-inverting input of said operational amplifier of each of said plurality of amplification assemblies.

11. The system of claim 10, wherein:
each of said plurality of amplification assemblies for the amplification of a bipolar input signal is configured to receive a respective audio input signal; and
a system output is received from a system output port derived from a mix of said audio input signals.

12. An audio mixing console including the system of claim 11.

13. A method of amplifying a bipolar input signal, comprising the steps of:
energizing a dependent current source from a positive supply rail;
driving said dependent current source from an output of an operational amplifier to supply current to an output port;
energizing a dependent current sink from a negative supply rail;
driving said dependent current sink from said output of said operational amplifier to receive current from said output port;
supplying an input signal to an inverting input of said operational amplifier;
supplying a first negative feedback signal from said dependent current source to said inverting input;
supplying a second negative feedback signal from said dependent current sink to said inverting input;
driving said operational amplifier from a combination of said input signal, said first negative feedback signal and said second negative feedback signal, such that a feedback current difference drives the operational amplifier in combination with said input signal;

connecting a supply noise compensator between said positive supply rail and said negative supply rail; and supplying a noise compensation signal to a non-inverting input of said operational amplifier.

14. The method of claim 13, wherein said step of driving said dependent current source comprises the step of driving a first field-effect transistor; and said step of driving said dependent current sink comprises driving a second field-effect transistor.

15. The method of claim 14, wherein:

said step of driving a first field-effect transistor comprises driving a positive metal-oxide-silicon field-effect transistor (PMOS FET); and said step of driving a second field-effect transistor comprises driving a negative metal-oxide-silicon field-effect transistor (NMOS FET).

16. The method of claim 15, wherein each of said PMOS FET and said NMOS FET includes a gate, a source and a drain, comprising the steps of:

resistively connecting the source of said PMOS FET to said positive supply rail;

resistively connecting the source of said NMOS FET to said negative supply rail;

applying a first bias to said dependent current source from a first level shifting circuit; and applying a second bias to said dependent current sink from a second level shifting circuit.

17. The method of claim 13, wherein said bipolar input signal is an audio signal.

* * * * *